(12) United States Patent
Yeo et al.

(10) Patent No.: US 12,354,934 B2
(45) Date of Patent: Jul. 8, 2025

(54) METHOD OF MANUFACTURING A SEMICONDUCTOR DEVICE

(71) Applicant: Amkor Technology Singapore Holding Pte. Ltd., Valley Point #12-03 (SG)

(72) Inventors: Siang Miang Yeo, Selangor (MY); Mohd Hasrul Bin Zulkifli, Selangor (MY)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 147 days.

(21) Appl. No.: 18/240,244

(22) Filed: Aug. 30, 2023

(65) Prior Publication Data
US 2023/0411257 A1   Dec. 21, 2023

Related U.S. Application Data

(62) Division of application No. 17/101,881, filed on Nov. 23, 2020, now Pat. No. 11,764,135, which is a (Continued)

(51) Int. Cl.
| | |
|---|---|
| *H01L 23/49* | (2006.01) |
| *H01L 21/48* | (2006.01) |
| *H01L 21/56* | (2006.01) |
| *H01L 23/495* | (2006.01) |
| *H01L 23/498* | (2006.01) |

(52) U.S. Cl.
CPC .... *H01L 23/49805* (2013.01); *H01L 21/4825* (2013.01); *H01L 21/4842* (2013.01); *H01L 21/56* (2013.01); *H01L 21/561* (2013.01); *H01L 23/49524* (2013.01); *H01L 23/49537* (2013.01); *H01L 23/49551* (2013.01); (Continued)

(58) Field of Classification Search
CPC ........... H01L 23/49805; H01L 21/4825; H01L 21/4842; H01L 21/56; H01L 21/561; H01L 23/49524; H01L 23/49537; H01L 23/49551; H01L 23/49562; H01L 23/49548; H01L 23/49575
See application file for complete search history.

(56) References Cited

U.S. PATENT DOCUMENTS

| | | |
|---|---|---|
| 6,608,366 B1 | 8/2003 | Fogelson et al. |
| 7,285,849 B2 | 10/2007 | Cruz et al. |

(Continued)

*Primary Examiner* — S M Sohel Imtiaz
(74) *Attorney, Agent, or Firm* — Kevin B. Jackson

(57) ABSTRACT

A method for forming packaged electronic devices includes providing a substrate having pads connected by conductive pad linking portions and semiconductor devices attached to the pads in different orientations. A second substrate is provided having conductive connectors each with a plate portion, a conductive member extending from a side segment of the plate portion, a connective portion extending from the conductive member distal to the plate portion, and conductive linking portions physically connecting adjoining plate portions together. Each plate portion is attached to one of the semiconductor devices to provide a subassembly. A package body is provided to encapsulate at least portions of the subassembly. The method includes separating the encapsulated subassembly to provide the packaged electronic devices such that the separating step severs the conductive linking portions.

20 Claims, 12 Drawing Sheets

Related U.S. Application Data division of application No. 15/869,447, filed on Jan. 12, 2018, now Pat. No. 10,896,869.

(52) U.S. Cl.
CPC .. *H01L 23/49562* (2013.01); *H01L 23/49548* (2013.01); *H01L 23/49575* (2013.01)

(56) References Cited

U.S. PATENT DOCUMENTS

| | | | |
|---|---|---|---|
| 2004/0169289 A1* | 9/2004 | Satou | H01L 24/40 257/780 |
| 2005/0093127 A1* | 5/2005 | Fjelstad | H01L 21/56 257/690 |
| 2006/0001136 A1 | 1/2006 | Tao | |
| 2007/0114352 A1* | 5/2007 | Victor R. Cruz | H01L 24/97 248/316.7 |
| 2008/0272472 A1 | 11/2008 | Hata et al. | |
| 2010/0000772 A1* | 1/2010 | Letterman, Jr. | H01L 24/37 174/260 |
| 2011/0096509 A1* | 4/2011 | Yoshimochi | H01L 24/40 361/728 |
| 2013/0249051 A1* | 9/2013 | Saye | H01L 23/49568 257/528 |
| 2013/0307129 A1* | 11/2013 | Fujita | H01L 24/37 257/666 |
| 2014/0001616 A1* | 1/2014 | Daniels | H01L 23/49541 257/676 |
| 2014/0027891 A1* | 1/2014 | Kimura | H01L 21/56 257/675 |
| 2014/0191381 A1* | 7/2014 | Lee | H01L 23/49575 257/676 |
| 2015/0049421 A1* | 2/2015 | Paek | H01L 23/49548 361/676 |
| 2015/0179553 A1* | 6/2015 | Khor | H01L 21/4821 257/676 |
| 2015/0270197 A1* | 9/2015 | Taguchi | H01L 24/73 257/670 |
| 2015/0348889 A1* | 12/2015 | Tsai | H01L 23/49524 257/676 |
| 2016/0093559 A1* | 3/2016 | Xue | H01L 23/49562 257/670 |
| 2016/0372403 A1 | 12/2016 | Lam | |
| 2017/0077361 A1 | 3/2017 | Brandl | |
| 2017/0141019 A1 | 5/2017 | Arrigoni | |
| 2017/0141068 A1 | 5/2017 | Kadoguchi | |
| 2019/0057921 A1* | 2/2019 | Ooshima | G01N 29/04 |
| 2019/0206772 A1* | 7/2019 | How | H01L 24/49 |

* cited by examiner

METHOD OF MANUFACTURING A SEMICONDUCTOR DEVICE

CROSS-REFERENCE TO RELATED APPLICATIONS

The present application is a divisional application of co-pending U.S. patent application Ser. No. 17/101,881 filed on Nov. 23, 2020, which is a divisional application of U.S. patent application Ser. No. 15/869,447 filed on Jan. 12, 2018 and issued as U.S. Pat. No. 10,896,869 on Jan. 19, 2021, which are expressly incorporated by reference herein, and priority thereto is hereby claimed.

BACKGROUND OF THE DISCLOSURE

The present disclosure relates, in general, to electronics, and more particularly, to semiconductor packages, structures thereof, and methods of forming semiconductor packages.

Prior semiconductor packages and methods for forming semiconductor packages are inadequate, for example resulting in excess cost, poor thermal performance, decreased reliability, relatively low performance, or package sizes that are too large. Further limitations and disadvantages of conventional and traditional approaches will become apparent to one of skill in the art, through comparison of such approaches with the present disclosure and reference to the drawings.

Accordingly, it is desirable to have a package structure and a method that provides a packaged semiconductor device that overcomes the shortcomings of the prior art. It is also desirable for the structure and method to be easily incorporated into manufacturing flows, accommodate multiple die interconnect schemes, and to be cost effective.

BRIEF SUMMARY

The present description includes, among other features, a method for forming a packaged electronic device and related packaged electronic device structures are disclosed including a conductive connector attached to an electronic device, which is further attached to a first substrate, such as a first leadframe. The conductive connector includes a plate portion and one or more connective portions that are configured to directly attach to a next level of assembly without intervening leads or lands within the packaged electronic device. The conductive connector further includes conductive linking portions that are attached to the conductive connector and further attached to one or more other conductive connectors as part of second substrate, such as a second leadframe. The conductive linking portions are configured to maintain the plate portions of the conductive connector in alignment with, for example, the first substrate, which in turn keeps the connective portions of the conductive connector in appropriate alignment. In addition, the conductive linking portions are configured to provide a connected and conductive current path for a plating process used to provide a conductive solder layer on exposed portions of the package electronic device during the assembly process. The method and structure provide packaged electronic devices with reduced costs, improved yields, and improved reliability.

More particularly, in one embodiment, a method for forming packaged electronic devices includes providing a first substrate comprising pads laterally spaced apart from each other, wherein at least two of the pads are connected by conductive pad linking portions. The method includes providing a second substrate comprising conductive connectors, wherein each conductive connector comprises a plate portion, a conductive member extending from a side segment of the plate portion, and a connective portion extending from the conductive member distal to the plate portion, and wherein the second substrate further comprises conductive linking portions physically connecting adjoining plate portions together. The method includes attaching electronic devices to each of the pads, wherein electronic devices on adjoining pads are attached in different orientations. The method includes attaching each plate portion to one of the electronic devices to provide a subassembly, wherein the conductive linking portions are configured to maintain the adjoining plate portions in substantial alignment with the first substrate during the step of attaching each plate portion to one of the electronic devices. The method includes forming a package body encapsulating the subassembly to provide an encapsulated subassembly, wherein bottom surfaces of each connective portion is exposed outside of a major surface of the package body. The method includes separating the encapsulated subassembly to provide the packaged electronic devices, wherein separating comprises severing the conductive linking portions and the conductive pad linking portions.

In another embodiment, a method for forming packaged electronic devices includes providing a first substrate comprising a first pad, and a second pad laterally spaced apart from the first pad. The method includes attaching a first semiconductor device to the first pad and a second semiconductor device to the second pad, wherein the first semiconductor device has a first orientation on the first pad, the second semiconductor device has a second orientation on the second pad, and the first orientation is different than the second orientation. The method includes providing a second substrate comprising a first conductive connector comprising a first plate portion, a first conductive member extending from a first side segment of the first plate portion, a first connective portion attached to the first conductive member distal to the first side segment of the first plate portion; a second conductive connector comprising a second plate portion, a second conductive member extending from a first side segment of the second plate portion, and a second connective portion attached to the second conductive member distal to the first side segment of the second plate portion, and a first conductive linking portion attached at one end to a second side segment of the first plate portion and attached at an opposite end to a second side segment of the second plate portion. The method includes connecting the first plate portion to the first semiconductor device and the second plate portion to the second semiconductor device to provide a subassembly. The method includes forming a package body encapsulating the subassembly to provide an encapsulated subassembly, wherein bottom surfaces of the first connective portion and the second connective portion are exposed outside of a major surface of the package body. The method includes separating the encapsulated subassembly to provide the packaged electronic devices, wherein separating comprises severing the first conductive linking portion. The first conductive linking portion is configured to maintain the first plate portion and the second plate portion substantially in alignment with, for example, the first substrate and/or the first and second semiconductor devices during the connecting step.

In a further embodiment, a method for forming packaged electronic devices includes providing a first substrate comprising a first pad, and a second pad laterally spaced apart from the first pad. The method includes attaching a first semiconductor device to the first pad and a second semiconductor device to the second pad, wherein the first semiconductor device has a first orientation on the first pad, the second semiconductor device has a second orientation on the second pad, and the first orientation is different than the second orientation. The method includes providing a second substrate comprising a first conductive connector comprising a first conductive connector comprising a first plate portion, a first conductive member extending from a first side segment of the first plate portion, a first connective portion attached to the first conductive member distal to the first side segment of the first plate portion; a second conductive connector comprising a second plate portion, a second conductive member extending from a first side segment of the second plate portion, a second connective portion attached to the second conductive member distal to the first side segment of the second plate portion, and a first conductive linking portion attached at one end to a second side segment of the first plate portion and attached at an opposite end to a second side segment of the second plate portion. The method includes connecting the first plate portion to the first semiconductor device and the second plate portion to the second semiconductor device to provide a subassembly. The method includes forming a package body encapsulating the subassembly to provide an encapsulated subassembly, wherein bottom surfaces of the first connective portion and the second connective portion are exposed outside of a major surface of the package body. The method includes plating a layer of material on portions of the encapsulated subassembly including the bottom surfaces of the first connective portion and the second connective portion, wherein the first conductive linking portion is configured to provide a current path for the step of plating. The method includes separating the encapsulated subassembly to provide the packaged electronic devices, wherein separating comprises severing the first conductive linking portion. The first conductive linking portion is configured to maintain the first plate portion and the second plate portion substantially in alignment with, for example, the first substrate and/or the first and second semiconductor devices during the connecting step.

Other examples are included in the present disclosure. Such examples may be found in the figures, in the claims, and/or in the description of the present disclosure.

Figure 1:
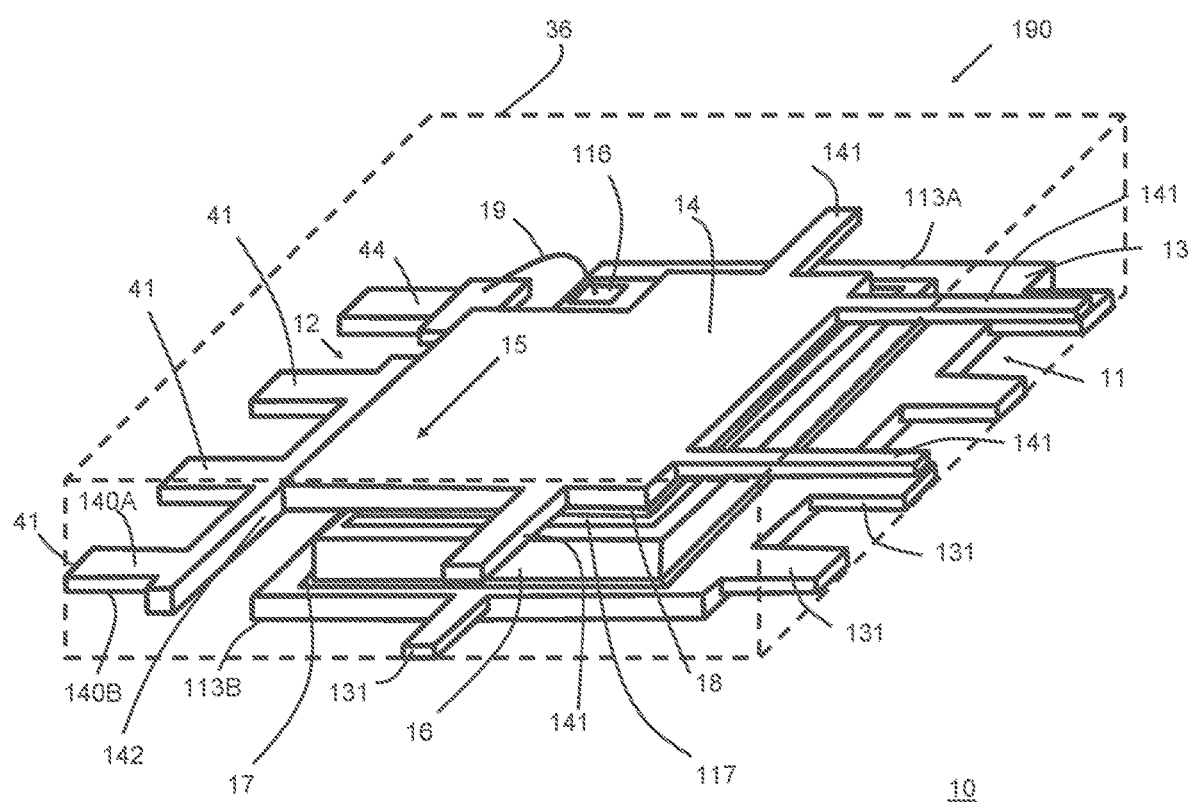
FIG. 1 illustrates a perspective view of an example packaged electronic device of the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

FIG. 1 illustrates perspective view of an example packaged electronic device 10, such as a packaged semiconductor device 10. The example is illustrated as a leadless power semiconductor device package structure, but the description is not limited to this type of package. In the example illustrated in FIG. 1, packaged semiconductor device 10 can comprise a conductive substrate 11, a conductive substrate 12, an electronic component 16, such as a semiconductor device 16, protective material 36 (illustrated as transparent in this figure), and an interconnect structure 19. Semiconductor device 16 can comprise conductive electrode structures 116 and 117 disposed on a major surface. Conductive substrate 11 can comprise a conductive pad 13, and conductive substrate 12 can comprise a conductive connector 15. In the present example, conductive connector 15 includes a conductive plate portion 14 and a conductive member 142, which extends outward and preferably downward from an edge segment of conductive plate portion 14. In some examples, one or more connective portions 41 are attached to conductive member 142 and are distal to conductive plate portion 14. In the present example, conductive member 142 is bent or angled such that connective portions 41 and conductive plate 14 are disposed on different planes as generally illustrated in FIG. 1.

Connective portions 41 are configured to be exposed through a major surface (in some examples, a bottom surface or downward facing surface) of protective material 36 and further configured to directly connect to a next level of assembly, such as a printed circuit board. Stated a different way, connective portions 41 are not connected to other intervening lands, leads, or lead structures provided, for example, as part of conductive substrate 11. In accordance with the present embodiment, conductive substrate 12 further comprises one or more conductive linking portions 141 attached along one or more side or edge segments of conductive plate portion 14. As will be explained in more detail later, conductive linking portions 141 are attached at one end to a first conductive plate portion and attached at an opposite end to a second conductive plate portion provided as part of conductive substrate 12.

Conductive linking portions 141 are configured to maintain the conductive plate portion 14 substantially in alignment with, for example, semiconductor device 16 or pad 13 during an attachment process. Conductive linking portions 141 are further configured to maintain connective portions 41 substantially in a proper or a desired alignment. In addition, conductive linking portions 141 are configured to provide a connected current path for a plating process used to form conductive layers on portions of the assembly, such as outward facing surfaces (i.e., surfaces exposed to the outside of protective material 36) of connective portions 41.

In some examples, conductive substrate 11 can be provided with conductive linking portions 131 or pad linking portions 131 attached along one or more side or edge segments of pad 13. Conductive linking portions 131 are attached at one end to a first pad, such as pad 13, and attached at another end to another pad provided as part of substrate 11. Conductive linking portions 131 are configured to maintain the pads in place during assembly and to further provide a connected current path for the plating process used to form conductive layers on portions of the assembly, such as the outward facing surface of the pads, such as pad 13.

Semiconductor device 16 can be attached to pad 13 of conductive substrate 11 with an attachment material 17, which in some examples can be a thermally conductive and electrically conductive material. In the present example, semiconductor device 16 is provided as a power semiconductor device, such as an insulated gate field effect transistor (IGFET) device. In the present example, conductive electrode 116 can be configured as a control electrode, such as a gate electrode, and conductive electrode 117 can be configured as a current-carrying electrode, such as a source electrode. In some examples, semiconductor device 16 further includes another conductive electrode provided on an opposing major surface of semiconductor device 16, which in the present embodiment can be a drain electrode electrically connected to pad 13. It is understood that in other examples, semiconductor device 16 can comprise other types of devices including, but not limited to integrated circuits devices, sensor devices, optical devices, and other devices known to those skilled in the art.

In some examples, conductive plate portion 14 can be attached to conductive electrode 117 with an attachment material 18, which can be a thermally conductive and electrically conductive material. In the present example, conductive electrode 116 is electrically connected to a lead 44 with interconnect structure 19, which can be a wire bond, a ribbon bond, or other conductive connective structures known to those skilled in the art.

Interconnect structure 19, protective material 36, conductive substrates 11 and 12, (including pad 13 and conductive connector 15) and attachment materials 17 and 18 can be referred to as a semiconductor package 190, and package 190 can provide protection for semiconductor device 16 from external elements and/or environmental exposure. In addition, semiconductor package 190 can provide electrical coupling from external electrical components (not shown) to conductive electrodes 116 and 117 as well as the drain electrode described previously.

In the present example, pad 13 can also be referred to as flag 13, die attach pad 13, die pad 13, or support pad 13, and conductive connector 15 can be referred to as a clip 15. Plate portion 14 can be referred to as a roof portion 14, and conductive member 142 can be referred to as a conductive tail portion 142. Conductive linking portions 131 and 141 can be referred to as conductive linking structures 131, 141, conductive stabilizing leads 131, 141, or conductive interconnect structures 131, 141. In some examples, the widths of conductive interconnect structures 131 can be different depending on their location along pad 13. Pad 13 includes a pad top surface 113A and an opposing pad bottom surface 113B. Pad top surface 113A is generally the surface of pad 13 proximate to semiconductor device 16 and pad bottom surface 113B is generally the surface of pad 13 distal to semiconductor device 16. Connective portions 41 each include a connective portion top surface 140A and an opposing connective portion bottom surface 140B, which is directly exposed to the outside of package body 36 and can be further coated with a conductive layer 51 (illustrated in FIG. 13).

Figure 2:
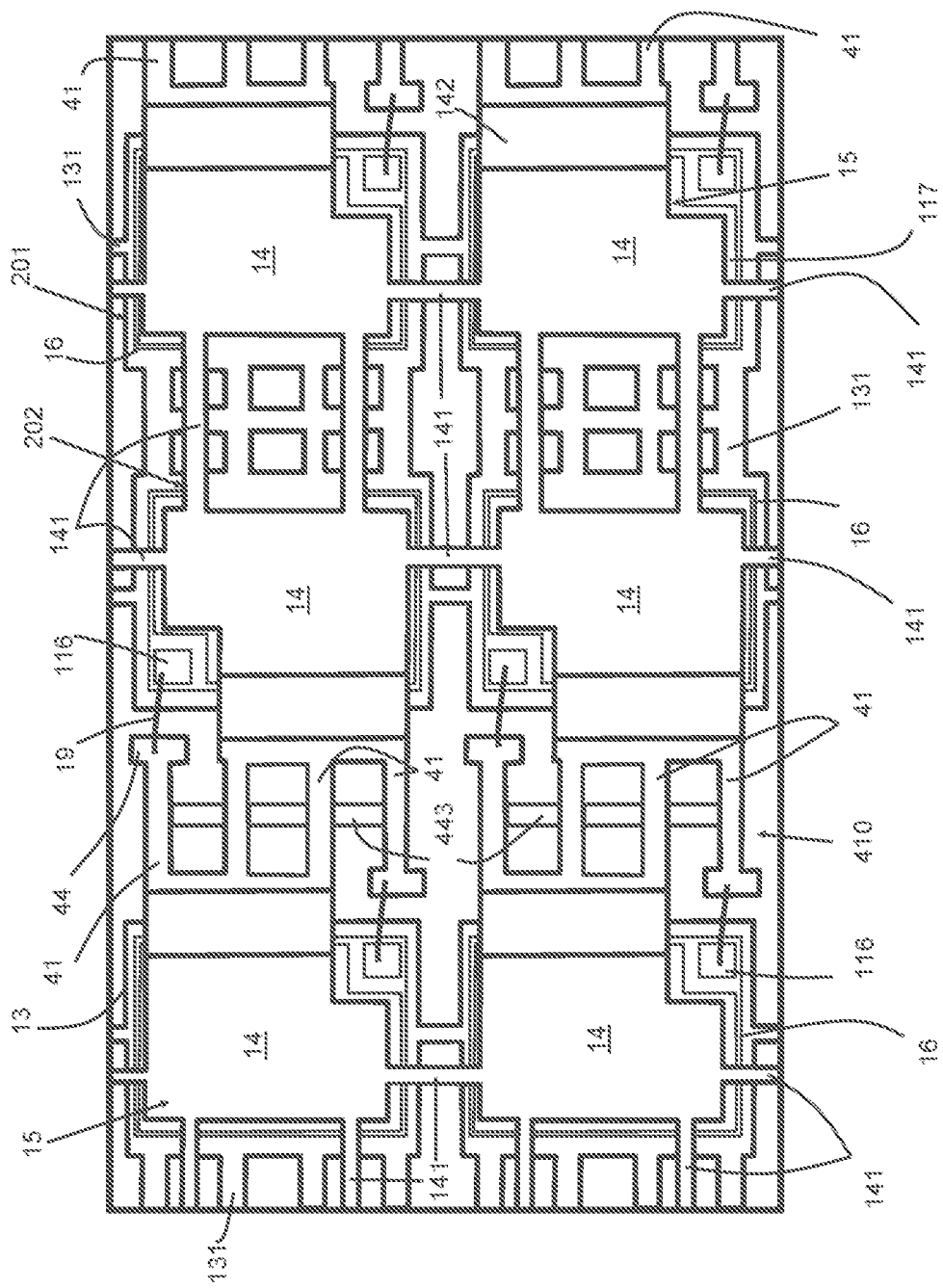
FIG. 2 illustrates a top view of an example subassembly of electronic devices of the present description at a step in fabrication.

FIG. 2 illustrates a top view of an example subassembly 200 of electronic devices at a step in fabrication. In the present example, subassembly 200 comprises a substrate 201 or first substrate 201, which includes pads 13 interconnected to each other with conductive linking portions 131. In the present example, substrate 201 is provided in a 2×3 array of pads 13. It is understood that other array sizes can be used as well. In the present example, the conductive interconnect portions 131 in each row can have a different width than the interconnect portions 131 extending between the adjoining rows.

Subassembly 200 further includes semiconductor devices 16 disposed on, disposed adjacent to, or attached to pads 13. In accordance with the present example, semiconductor devices 16 in each column have a similar orientation, but the orientation of the semiconductor devices 16 in adjoining columns is different. Stated a different way, adjoining semiconductor devices 16 in the same row of the array have a different orientation. In some examples, the semiconductor devices 16 in columns 1 and 2 are rotated or oriented approximately 180 degrees from each other as noted, for example, by the location of conductive electrodes 116 of the adjacent semiconductor device 16. Similarly, the semiconductor devices 16 in columns 2 and 3 are rotated or oriented approximately 180 degrees from each other. Stated a different way, the semiconductor devices 16 in every other column are oriented similarly while the semiconductor devices 16 in adjoining columns are oriented differently.

This orientation of semiconductor devices 16 is to facilitate attaching to or connecting with a preferred configuration of substrate 202 or second substrate 202.

Substrate 202 includes conductive connectors 15, which each include a plate portion 14 and connective portions 41 extending outward from a side segment of plate portion 14. Substrate 202 further includes conductive linking portions 141 attached at one end to a first plate portion 14 and attached at another end to another plate portion 14 either in the same row of the array or in an adjoining row of the array as generally illustrated in FIG. 2. As shown in FIG. 2, adjoining plate portions 14 in columns 1 and 2 have conductive connective portions 41 configured in an interconnected structure 410 where conductive connective portions 41 are joined together and can be further connected by conductive linking portions 443. Similarly, adjoining plate portions 14 in column 3 can have conductive connective portions 41 configured in the interconnected lead structure 410 with another plate portion (not shown) where the conductive connective portions 41 are joined together and can be further connected by conductive linking portions 443. In the present example, plate portions 14 in columns 2 and 3 are joined together by one or more conductive linking portions 141. In one preferred example, each plate portion 14 comprises at least four linking portions 141 attached to it. In accordance with the present example, plate portions 14 are each attached to conductive electrode 117 of semiconductor devices 16 and conductive electrodes 116 are electrically connected to leads 44 with conductive interconnect structures 19. For ease of illustration and by way of example, subassembly 200 is shown without protective material 36.

Figure 3:
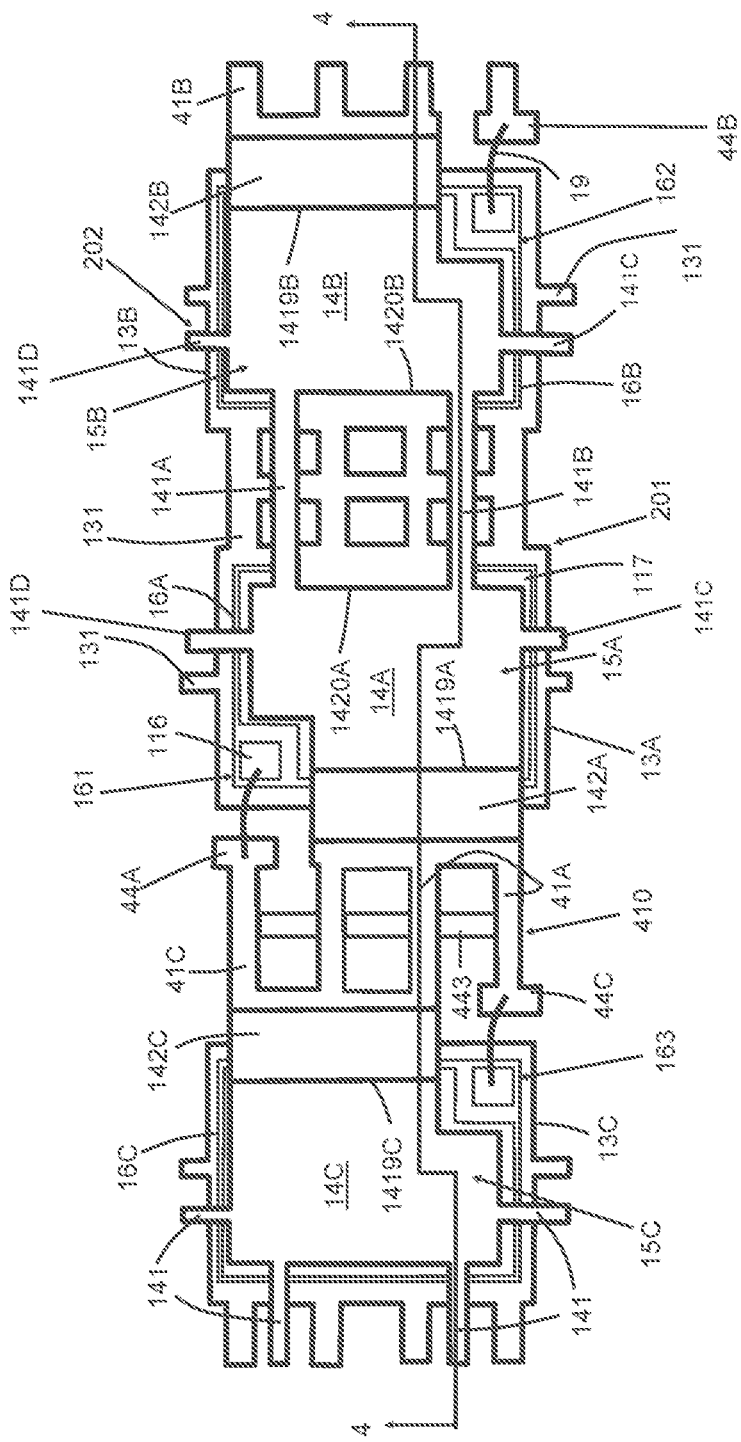
FIG. 3 illustrates a partial top view of the subassembly of FIG. 2.
Figure 4:
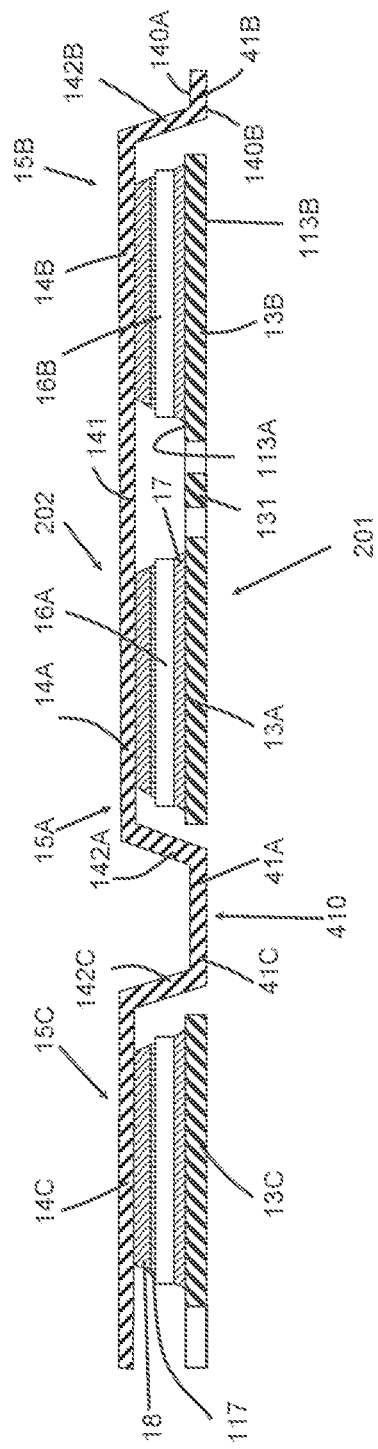
FIG. 4 illustrates a cross-sectional view of the subassembly of FIG. 3.

FIG. 3 is a partial top view of subassembly 200 of FIG. 2, and FIG. 4 is a cross-sectional view of subassembly of FIG. 3 taken along reference line 4-4. FIGS. 3 and 4 illustrate an example of a first substrate 201 provided comprising a first pad 13A and a second pad 13B laterally spaced apart from first pad 13A. In some examples, first pad 13A and second pad 13B are connected together with one or more conductive linking portions 131.

A first semiconductor device 16A is attached to first pad 13A in a first orientation 161 and a second semiconductor device 16B is attached to second pad 13B in a second orientation 162 such that first orientation 161 is different than the second orientation 162. Attachment material 17 can be used for attaching semiconductor devices 16A and 16B to first pad 13A and second 13B respectively. In the present example, the first orientation 161 is such that first semiconductor device 16A is rotated approximately 180 degrees compared to the second orientation 162 of semiconductor device 16B as noted by the location of the respective conductive electrodes 116 of semiconductor devices 16A and 16B.

A second substrate 202 is provided with a first conductive connector 15A comprising a first plate portion 14A and a first conductive member 142A extending from a first side segment 1419A of first plate portion 14A, and a second conductive connector 15B comprising a second plate portion 14B and a second conductive member 142B extending from a first side segment 1419B of second plate portion 14B. One or more first connective portions 41A are attached to first conductive member 142A distal to first side segment 1419A of first plate portion 14A. One or more second connective portions 41B are attached to a second conductive member 142B distal to first side segment 1419B of second plate portion 14B. One or more conductive linking portions 141 are attached at one end to a second side segment 1420A of first plate portion 14A and attached at an opposite end to a second side segment 1420B of second plate portion 14B.

First plate portion 14A is connected to conductive electrode 117 of semiconductor device 16A and second plate portion 14B is connected to conductive electrode 117 of semiconductor device 16B using, for example, attachment material 18. In the present example, conductive linking portions 141 are configured to maintain first plate portion 14A and second plate portion 14B in substantial alignment with, for example, semiconductor device 16A and semiconductor device 16B respectively and/or first substrate 201 during the step of connecting the plate portions to the semiconductor devices.

In some examples, first substrate 201 can be provided with a third pad 13C in a configuration where first pad 13A is interposed between second pad 13B and third pad 13C as generally illustrated in FIGS. 3 and 4. A third semiconductor device 16C can be attached to third pad 13C with attachment material 17. In accordance with the present example, third semiconductor device 16C is attached to third pad 13C having a third orientation 163. More particularly, third orientation 163 is such that third semiconductor device 16C is rotated approximately 180 degrees compared to the first orientation 161 of first semiconductor device 16A as noted by the location of the respective conductive electrodes 116 of semiconductor devices 16A and 16C. In the present example, third orientation 163 is similar to second orientation 162. In one example, third orientation 163 and second orientation 162 are substantially the same.

In the present example, second substrate 202 can be further provided with a third conductive connector 15C comprising a third plate portion 14C and a third conductive member 142C extending from a first side segment 1419C of third plate portion 14C. One or more third connective portions 41C are attached to third conductive member 142C distal to first side segment 1419C of third plate portion 14C. In the present example, third connective portions 41C are interconnected with first connective portions 41A to provide interconnected structure 410. Second substrate 202 can further include conductive linking portions 141 attached at one end to third plate portion 14C and attached at other ends to other plate portions or other structures in second substrate 202. Like conductive linking portions 141, interconnected structure 410 is configured to maintain first plate portion 14A and third plate portion 14C substantially in alignment with, for example, first semiconductor device 16A and third semiconductor device 16C and/or first substrate 201 respectively during the step of connecting the plate portions 14A, 14B, and 14C to the semiconductor devices 16A, 16B, and 16C.

In the present example, conductive electrode 116 of first semiconductor device 16A is electrically connected to a lead 44A with a conductive connective structure 19 and conductive electrode 116 of third semiconductor device 16C is electrically connected to another lead 44C with a conductive connective structure 19. In accordance with the present example, lead 44A and lead 44C are disposed on opposite or opposing ends or sides of interconnected structure 410. Further, lead 44A is initially interconnected with one of third conductive connective portions 41C, and lead 44C is initially interconnected with one of first conductive connective portions 41A. In a subsequent step, interconnected structure 410 is separated during a singulation process so that leads 44A and 44C are disconnected in the final packaged electronic device structure. In some embodiments, a conductive linking portion 443 is interconnected with first connective portions 41A and third connective portions 41C. In some examples, conductive linking portion 443 provides additional stability for second substrate 202 during the assembly process.

FIG. 3 illustrates an example of second substrate 202 provided comprising the first plate portion 14A and the second plate portion 14B each having at least four conductive linking portions 141 attached thereto including a first conductive linking portion 141A, where two of the conductive linking portions (e.g., 141C and 141D) other than the first conductive linking portion 141A are an opposing sides of each of the first plate portion 14A and the second plate portion 14B, and only the first conductive linking portion 141A and another one of the conductive linking portions 141B are directly attached between both the first plate portion 14A and the second plate portion 14B. In some examples, conductive linking portions 141C and 141D are configured to attach to other plate portions (for example, as illustrated in FIG. 2) in the subassembly.

FIGS. 5 through 15 illustrate partial top views and partial cross-sectional views of example packaged electronic devices 10 of the present description at various steps in fabrication.

Figure 5:
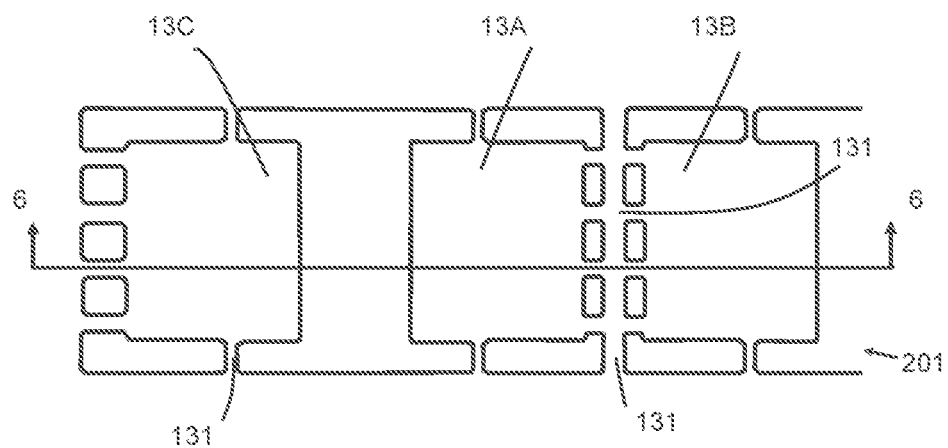
FIGS. 5 through 15 illustrate partial top views and partial cross-sectional views of example packaged electronic devices of the present description at various steps of fabrication.
Figure 6:
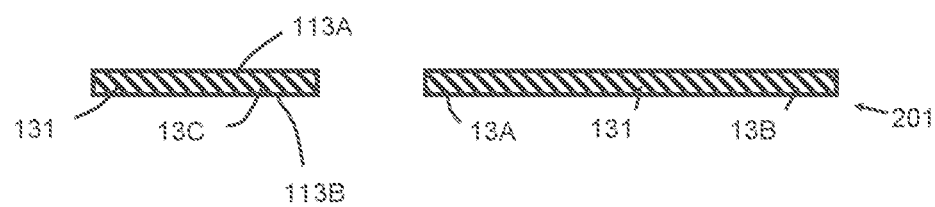

Starting with FIG. 5, substrate 201 having pads 13A, 13B, and 13C and conductive linking portions 131 is provided at an early step of fabrication. FIG. 6, which illustrates substrate 201 in cross-sectional view taken along reference line 6-6 of FIG. 5, further shows an example of pad top surface 113A and opposing pad bottom surface 113B. In one example, substrate 201 is a conductive leadframe that comprises one or more metal materials, such as copper, a copper alloy, nickel-iron-cobalt alloys, iron-nickel alloys (e.g., Alloy 42), plated materials, or other materials known to those skilled in the art. Substrate 201 can comprise a thickness of about 450 microns or less in some examples, and can be formed using etching, stamping, punching, and other processes known to those skilled in the art.

Figure 7:
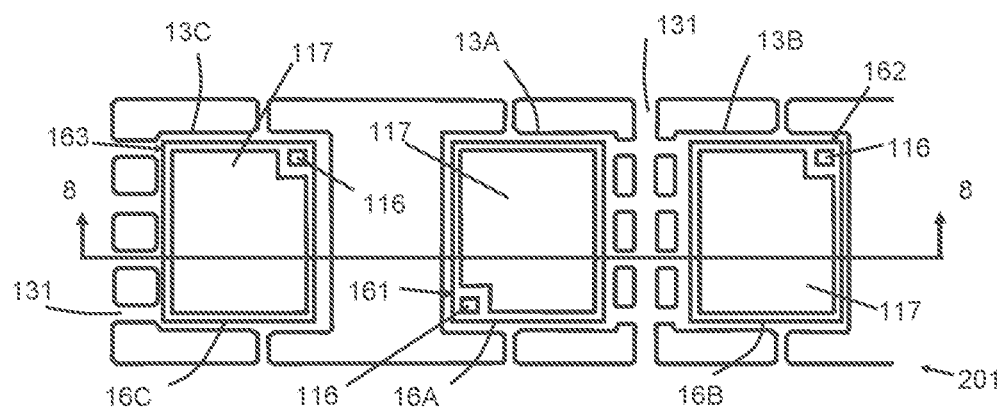
Figure 8:
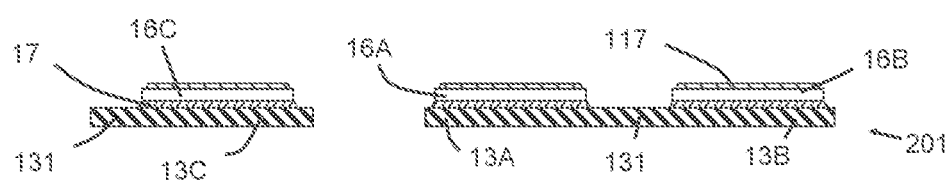

FIG. 7 illustrates a partial top view of substrate 201 after additional processing and FIG. 8 is a cross-sectional view taken along reference line 8-8 of FIG. 7. In some examples, semiconductor devices 16A, 16B, and 16C are attached or connected to pads 13A, 13B, and 13C respectively using attachment material 17 as illustrated in FIG. 8. By way of example, attachment material 17 can be a solder paste, a conductive epoxy, conductive adhesives, conductive films, or other materials known to those skilled in the art. As illustrated in FIG. 7, semiconductor device 16A is provided with first orientation 161 on pad 13A, semiconductor device 16B is provided with second orientation 162 on pad 13B, and semiconductor device 16C is provided with third orientation 163 on pad 13C. In accordance with the present example, first orientation 161 is different than second orientation 162 and third orientation 163. In some examples, first orientation 161 is approximately 180 degrees rotated with respect to second orientation 162 and or third orientation 163. This configuration is preferred to accommodate a preferred configuration for substrate 202, which is provided and attached as illustrated in FIGS. 9 and 10.

Figure 9:
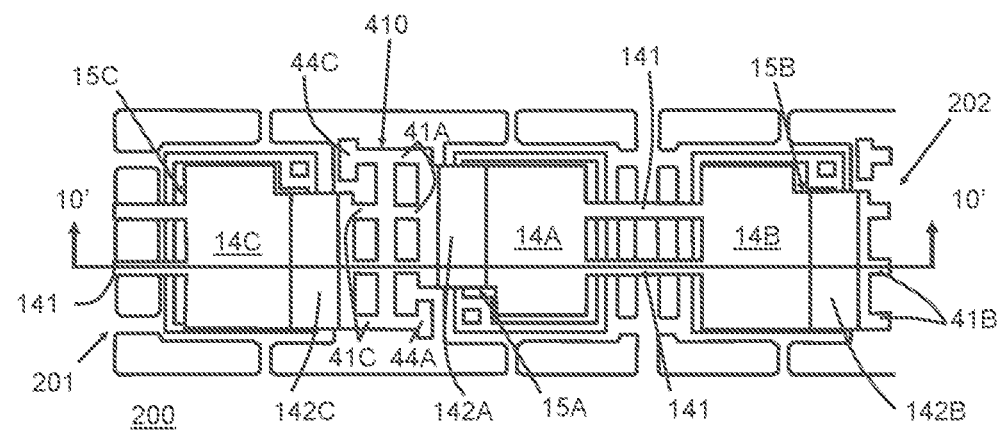
Figure 10:
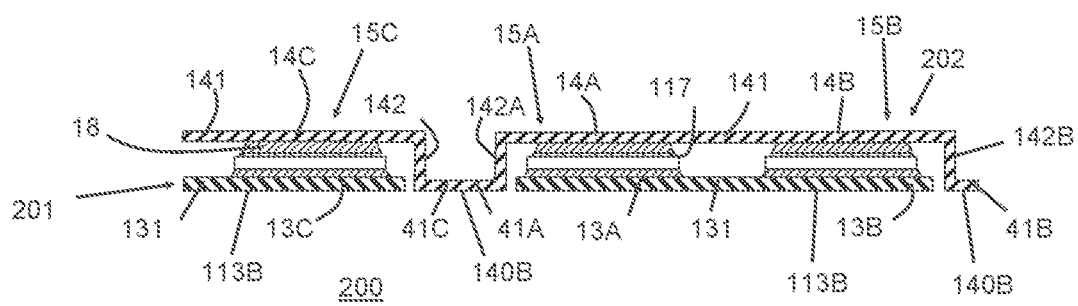

FIG. 9 illustrates a partial top view of the structure after substrate 202 has been connected or attached, and FIG. 10 is a cross-sectional view taken along reference line 10'-10' of FIG. 9. In some examples, substrate 202 is provided comprising first conductive connector 15A, second conductive connector 15B, third conductive connector 15C, and conductive linking portions 141 attached to the conductive connectors. In the present example, first conductive connector 15A comprises first plate portion 14A, first conductive member 142A, and first connective portions 41A; second conductive connector 15B comprises second plate portion 14B, second conductive member 142B, and second connective portions 41B; and third conductive connector 15C comprises first plate portion 14C, first conductive member 142C, and first connective portions 41C. In the present example, third connective portions 41C are interconnected with first connective portions 41A to provide interconnected structure 410, and conductive plate 14A is interconnected to conductive plate 14B using conductive linking portions 141. Interconnected structure 410 further includes a lead 44A on one side and a lead 44C on an opposite side or end.

In one example, substrate 202 is a conductive leadframe that comprises one or more metal materials, such as copper, a copper alloy, nickel-iron-cobalt alloys, iron-nickel alloys (e.g., Alloy 42), plated materials, or other materials known to those skilled in the art. Substrate 202 can comprise a thickness of about 450 microns or less in some examples, and can be formed using etching, stamping, punching, and other processes known to those skilled in the art.

In the present example, in a connecting step, plate portion 14A is connected to conductive electrode 117 of semiconductor device 16A, plate portion 14B is connected to conductive electrode 117 of semiconductor device 16B, and plate portion 14C is connected to conductive electrode 117 of semiconductor device 16C using attachment material 18 to provide subassembly 200. In some examples, attachment material 18 can be a solder paste, a conductive epoxy, conductive adhesives, conductive films, or other materials known to those skilled in the art. In accordance with the present example, conductive linking portions 141 and interconnected structure 410 are configured to maintain conductive connectors 15 substantially in place and substantially in alignment during the connecting step. More particularly, this configuration reduces the amount conductive connectors 15 can rotate thereby maintaining the alignment integrity of subassembly 200. This improves, among other things, packaged electronic device yields and their reliability. In addition, in accordance with the present example, bottom surfaces 140B of connective portions 41A, 41B, and 41C are substantially co-planar with pad bottom surfaces 113B of pads 13A, 13B, and 13C such that connective portions 41A, 41B, and 41C are configured to be directly attached to a next level of assembly. With this configuration it is not necessary for substrate 201 to be provided with separate leads or lands for conductive connectors 15 to connect to. Among other things, this saves on assembly costs and reduces processing complexity.

Figure 11:
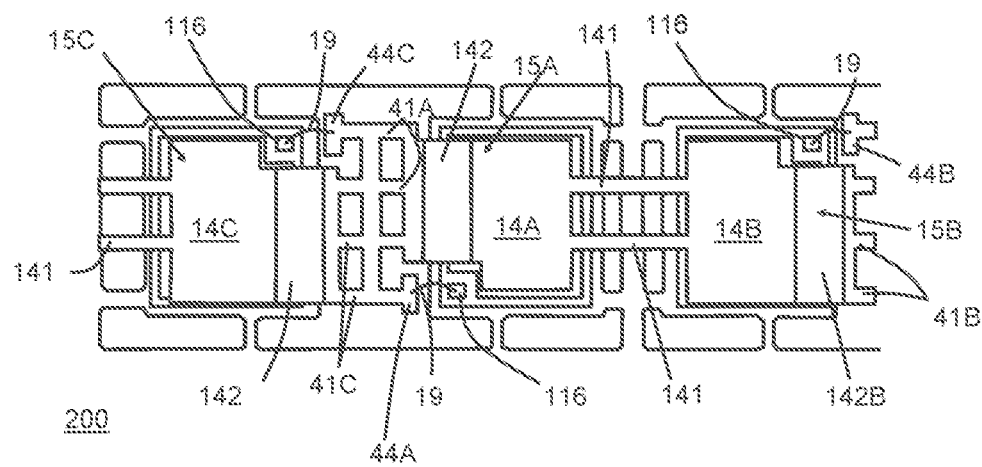

Next, as illustrated in FIG. 11, which is a partial top view of subassembly 200 after further processing, conductive interconnect structures 19 are attached to conductive electrodes 116 of semiconductor devices 16A, 16B, and 16C and to leads 44A, 44B, and 44C respectively. In some examples, conductive interconnect structures 19 can be wire bonds provided using techniques known to those skilled in the art. Other conductive interconnect structures 19 can be used, such as ribbon bonds, clips, or multiple wire bonds.

Figure 12:
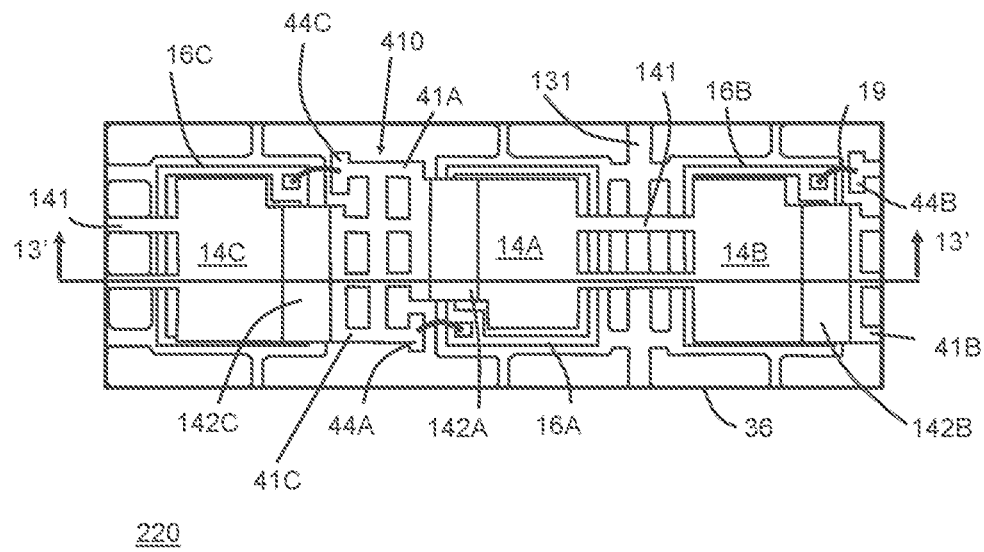
Figure 13:
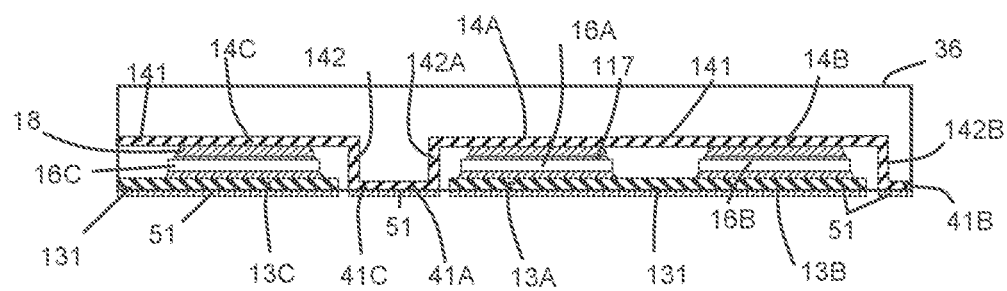

FIG. 12 is a partial top view of subassembly 200 after further processing and FIG. 13 is a cross-sectional view of FIG. 12 taken along reference line 13'-13'. In a subsequent step, protective material 36 is provided as a package body 36 encapsulating portions of subassembly 200 to provide encapsulated subassembly 220. In some examples, package body 36 is an over-molded structure that covers subassembly 200 including portions of substrates 201 and 202, semiconductor devices 16A, 16B, and 16C, conductive interconnect structures 19, and attachment materials 17 and 18 while leaving bottom surfaces 140B of connective portions 41A, 41B, and 41C and pad bottom surfaces 113B of pads 13A, 13B, and 13C exposed to the outside of package body 36. In some examples, package body 36 can be polymer based composite material, such as epoxy resin with filler, epoxy acrylate with filler, or polymer with proper filler. Package body 36 comprises a non-conductive and environmentally protective material that functions to protect semiconductor devices 16 from external elements and contaminants. Package body 36 may be formed using paste printing, compressive molding, transfer molding, overmolding, liquid encapsulant molding, vacuum lamination, other suitable applicator, or other processes as known to those of skill in the art. In some embodiments, package body 36 is an epoxy mold compound ("EMC") and can be formed using transfer or injection molding techniques.

In a subsequent step, encapsulated subassembly 220 can be suspended within a plating solution to form conductive layers 51 on exposed surfaces of encapsulated subassembly 220 as illustrated in FIG. 13. In some examples, conductive layers 51 are formed adjacent bottom surfaces 140B of connective portions 41A, 41B, and 41C and pad bottom surfaces 113B of pads 13A, 13B, and 13C. In accordance with the present example, interconnect structure 410 and conductive linking portions 141, which tie or link substrate 202 together, are configured to provide a connected current path for electroplating conductive layers 51 onto portions of encapsulated subassembly 220, such as bottom surfaces 140B of connective portions 41A, 41B, and 41C and pad bottom surfaces 113B of pads 13A, 13B, and 13C. In some examples, conductive layers 51 can be a solderable material, such as tin based solder or other solderable materials as known to those of skill in the art. In one embodiment, conductive layers 51 can be a matte tin material having a thickness in range from approximately 300 to approximately 800 micro inches (approximately 7.6 microns to approximately 23.0 microns). Conductive layers 51 are configured to enhance the connectivity of the packaged electronic devices to next levels of assembly.

Figure 14:
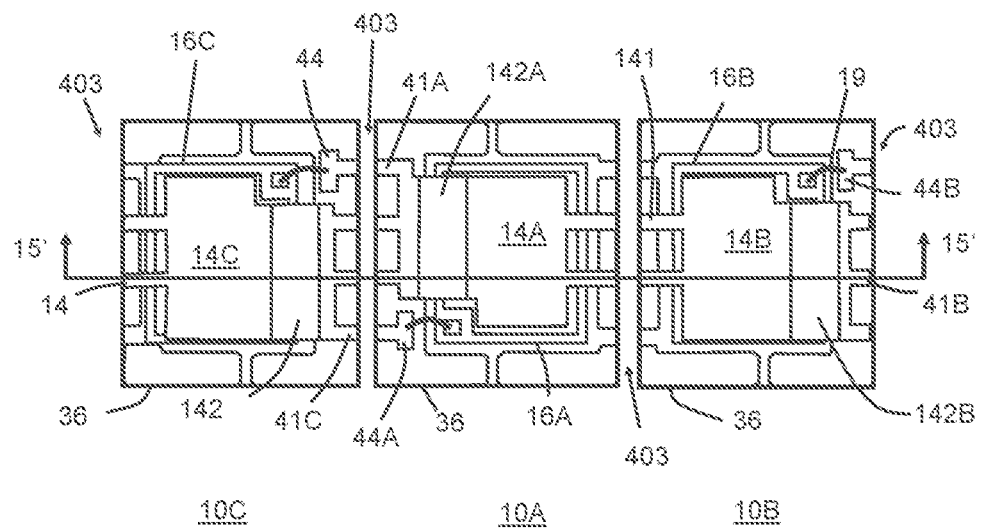
Figure 15:
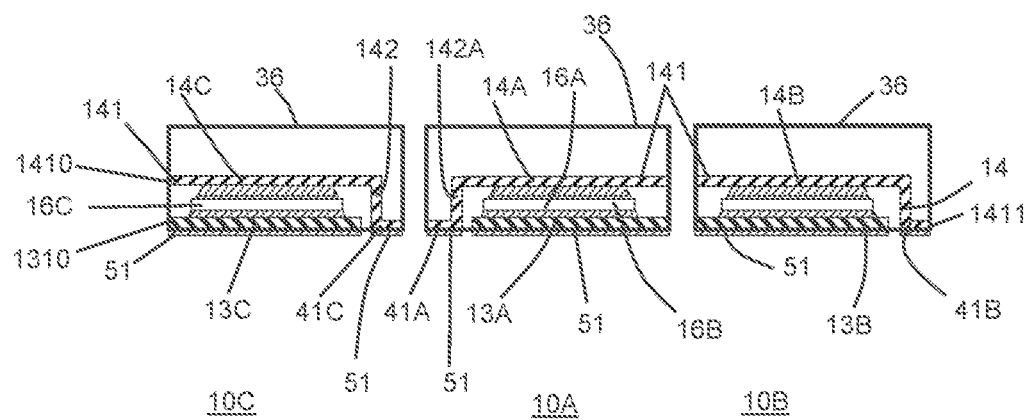

FIG. 14 is a partial top view of encapsulated subassembly 220 after additional processing and FIG. 15 is a cross-sectional view of FIG. 14 taken along reference line 15'-15'. In some examples, after conductive layers 51 are formed, encapsulated subassembly 220 is singulated or separated along separation regions 403 to provide packaged electronic devices 10A, 10B, and 10C. In some examples, a sawing process is used to singulate or separate encapsulated subassembly 220, but other separation processes can be used as known to those skilled in the art. In accordance with the present examples, the step of separating the encapsulated subassembly severs or cuts through conductive linking portions 131 and 141 as well as through interconnect structure 410. In accordance with this separation process, end portions 1310 and 1311 (illustrated in FIGS. 16-21) of conductive linking portions 131, end portions 1410 of conductive linking portions 141, and end portions 1411 of connective portions are exposed in side surfaces of package body 36.

Figure 16:
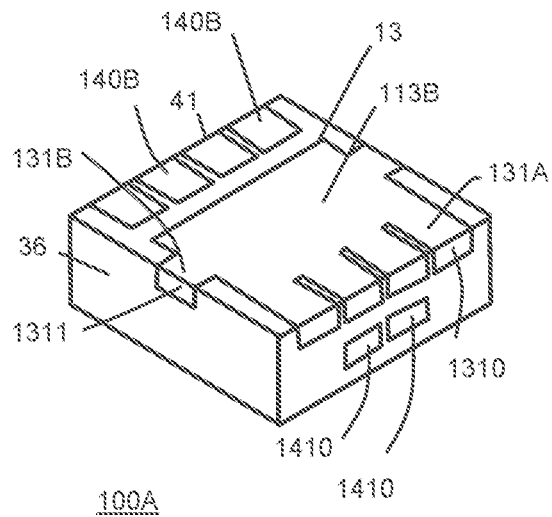
FIGS. 16 through 21 are perspective top and bottom views of example packaged electronic devices manufactured according with the present description.
Figure 17:
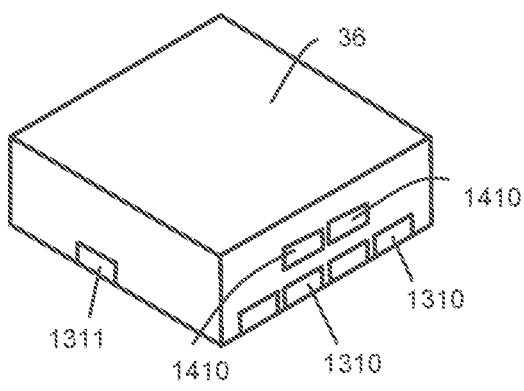
Figure 18:
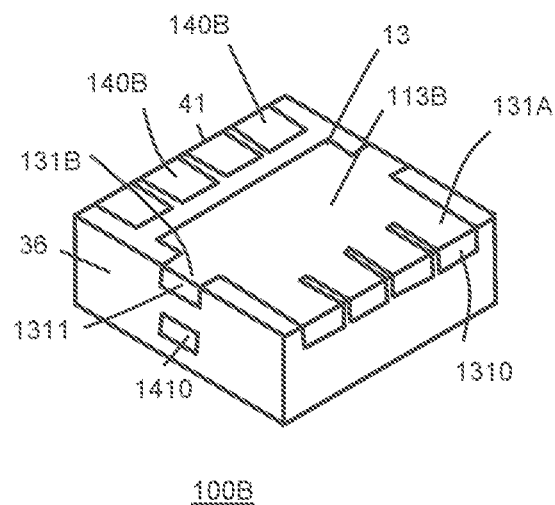
Figure 19:
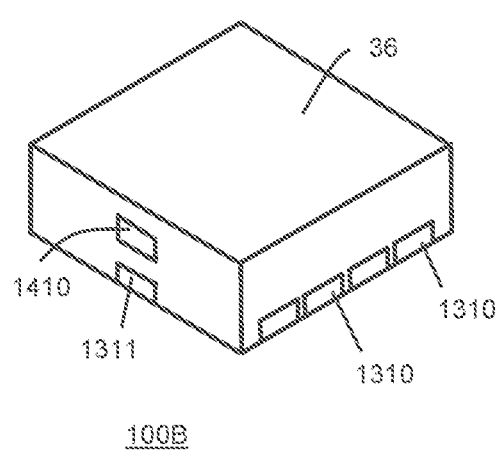
Figure 20:
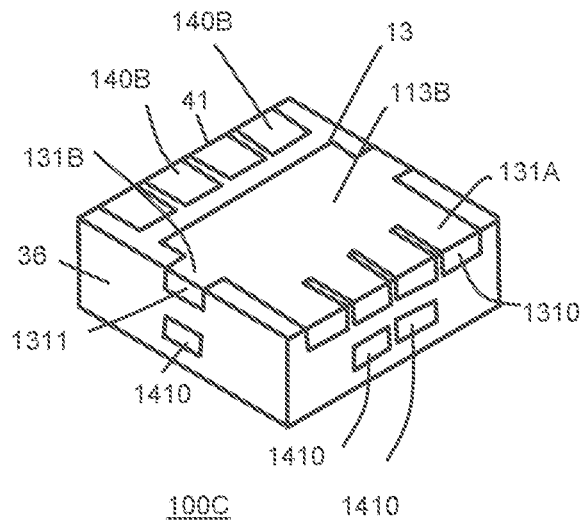
Figure 21:
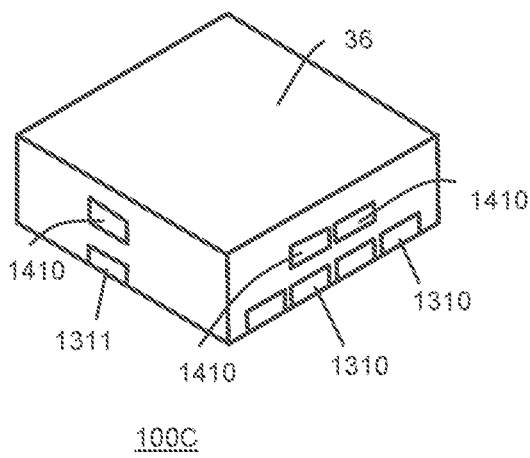

FIGS. 16-21 illustrate perspective top and bottom views of example packaged electronic devices 100A, 100B, and 100C after the separation process described previously. As illustrated in FIGS. 16-21, end portions 1310 and 1311 of conductive linking portions 131A and 131B, pad bottom surfaces 113B, end portions 1410 of conductive linking portions 141, and bottom surfaces 140B of connective portions 41 are exposed in surfaces of package bodies 36. In FIGS. 16 and 17, packaged electronic device 100A comprises end portions 1410 of conductive linking portions 141 exposed on the same side or surface of package body 36 as end portions 1310 of conductive linking portions 131A or pad lead area 131A of pad 13. In FIGS. 18 and 19, packaged electronic device 100B comprises end portions 1410 of conductive linking portion 141 exposed on the same side or surface of package body 36 as end portions 1311 of conductive linking portion 131B or pin portion 131B of pad 13. In FIGS. 20 and 21, packaged electronic device 100C comprises end portions 1410 of conductive linking portions 141 exposed on the same side or surface of package body 36 as pad lead area 131A of pad 13 and exposed on the same side of package body 36 as pin portion 131B of pad 13.

From all of the foregoing, one skilled in the art can determine that according to another embodiment, a packaged electronic device comprises a pad; a semiconductor device coupled to the pad; a conductive connector comprising a plate portion; a first conductive member extending from a first side segment of the plate portion; a connective portion attached to the conductive member distal to the first side segment of the plate portion; and a conductive linking portion attached at one end to a second side segment that is different than the first side segment of the first plate portion; and a package body encapsulating the semiconductor device, encapsulating at least portions of the pad, and encapsulating at least portions of the conductive connector, wherein: the connector portion is directly exposed outside a major surface of the package body; and another end of the conductive linking portion is exposed outside a side surface of the package body.

In summary, methods for forming a packaged electronic device and related packaged electronic device structures have been disclosed including a conductive connector attached to electronic device, which is further attached to a first substrate. The conductive connector includes a plate portion and one or more connective portions that are configured to directly attach to a next level of assembly without intervening leads or lands with the packaged electronic device. The conductive connector further includes conductive linking portions that are configured to be attached to the conductive connector and to one or more other conductive connectors as part of second substrate, such as a leadframe. The conductive linking portions are configured to maintain the plate portions in a desired alignment, which in turn keeps the connective portions in appropriate alignment. In addition, the conductive linking portions are configured to provide a connective current path for a plating process used to provide a conductive solder layer on exposed portions of the package electronic device during the assembly process. The method and structure provide packaged electronic devices with reduced costs, improved yields, and improved reliability.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art. By way of example, multiple electronic devices can be attached to a pad in side-by-side configurations, in stacked configurations, combinations thereof, or other configurations known to those skilled in the art. In addition, the packaged electronic device can have leads on less than all sides of the package body.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some, but not other features included in other embodiments, combinations of features of different embodiments are meant to be within the scope of the invention and meant to form different embodiments as would be understood by those skilled in the art.

What is claimed is:

1. A method for forming packaged electronic devices, comprising:
providing a first substrate comprising:
a first pad; and
a second pad laterally spaced apart from the first pad;
coupling a first semiconductor device to the first pad in a first orientation on the first pad in a top view;
coupling a second semiconductor device to the second pad in a second orientation on the second pad in the top view that is different than the first orientation;
providing a second substrate comprising:
a first conductive connector comprising:
a first plate portion comprising a first plate first side and a first plate second side; and
a first connective portion coupled to the first plate first side;
a second conductive connector comprising:
a second plate portion comprises a second plate first side and a second plate second side; and
a second connective portion coupled to the second plate first side; and
a first conductive linking portion attached at one end to the first plate second side and attached at an opposite end to the second plate second side;
connecting the first plate portion to the first semiconductor device and the second plate portion to the second semiconductor device to provide a subassembly;
providing a package body encapsulating the subassembly to provide an encapsulated subassembly; and
separating the encapsulated subassembly to provide the packaged electronic devices, wherein separating comprises severing the first conductive linking portion.

2. The method of claim 1, further comprising:
before separating, plating a conductor on portions of the subassembly wherein the first conductive linking portion is configured to provide a current path for plating.

3. The method of claim 2, wherein:
providing the second substrate comprises:
providing the first connective portion comprising a first connective portion bottom side; and
providing the second connective portion comprising a second connective portion bottom side;
forming the package body comprises providing the first connective portion bottom side and the second connective portion bottom side exposed from a bottom side of the package body; and
plating comprises plating the conductor on the first connective portion bottom side and the second connective portion bottom side.

4. The method of claim 1, wherein:
separating comprises exposing a portion of the first conductive linking portion in a side surface of the package body.

5. The method of claim 1, wherein:
providing the package body comprises overmolding the package body onto the subassembly.

6. The method of claim 1, wherein:
providing the first substrate comprises providing a second conductive linking portion attached at one end to a first side of the first pad and attached at an opposing end to a first side of the second pad; and
separating comprises severing the second conductive linking portion such that part of the second conductive linking portion is exposed in a side surface of the package body.

7. The method of claim 1, wherein:
providing the first substrate comprises:
providing the first pad comprising a first pad bottom side; and
providing the second pad comprising a second pad bottom side; and
providing the package body comprises exposing the first pad bottom side and the second pad from the package body.

8. The method of claim 1, wherein:
providing the second substrate comprises providing the first plate portion and the second plate portion each comprising at least four conductive linking portions attached thereto including the first conductive linking portion;
two of the at least four conductive linking portions other than the first conductive linking portion are on opposing sides of each of the first plate portion and the second plate portion; and
only the first conductive linking portion and another one of the at least four conductive linking portions are directly attached between both the first plate portion and the second plate portion.

9. The method of claim 1, wherein:
providing the first substrate comprises providing a third pad such that the first pad is interposed between the second pad and the third pad;
attaching comprises attaching a third semiconductor device to the third pad, the third semiconductor device having a third orientation on the third pad;
providing the second substrate comprises:
providing a third conductive connector comprising:
a third plate portion comprising a third plate first side and a third plate second side; and
a third connective portion coupled to the third plate first side, wherein:
the third connective portion is interconnected with the first connective portion to provide an interconnected structure;
providing a fourth conductive connector comprising a fourth plate portion; and
providing a second conductive linking portion attached at one end to the third plate second side and attached at an opposite end to the fourth plate portion;
connecting comprises connecting the third plate portion to the third semiconductor device; and
separating comprises separating the interconnected structure and the second conductive linking portion.

10. The method of claim 9, wherein:
providing the second substrate comprises providing a first lead and a second lead as part of the interconnected structure;
attaching comprises:
attaching the first semiconductor device comprising a first power semiconductor device comprising a first control electrode; and
attaching the third semiconductor device comprising another power semiconductor device comprising a second control electrode;
the method further comprises:

electrically coupling the first control electrode to the first lead; and
electrically coupling the second control electrode to the second lead; and
separating comprises separating the first lead and the second lead from the interconnected structure.

11. A method for forming packaged electronic devices, comprising:
providing a first substrate comprising:
a first pad comprising a first pad first edge;
a second pad laterally spaced apart from the first pad and comprising second pad first edge; and
a first conductive linking portion attached at one end to the first pad first edge and attached at an opposing end to the second pad first edge;
coupling a first electronic device to the first pad in a first orientation in a top view;
coupling a second electronic device to the second pad in a second orientation in the top view that is different than the first orientation;
providing a second substrate comprising:
a first conductive connector comprising:
a first plate portion comprising a first plate first side and a first plate second side; and
a first connective portion coupled to the first plate first side;
a second conductive connector comprising:
a second plate portion comprising a second plate first side and a second plate second side; and
a second connective portion coupled to the second plate first side; and
a second conductive linking portion attached at one end to the first plate second side and attached at an opposite end to the second plate second side;
connecting the first plate portion to the first electronic device and the second plate portion to the second electronic device to provide a subassembly;
forming a package body encapsulating the subassembly to provide an encapsulated subassembly, wherein portions of the first substrate and the second substrate are exposed from the package body;
plating a conductor on the portions of the first substrate and the second substrate exposed from the package body; and
separating the encapsulated subassembly to provide the packaged electronic devices;
wherein:
the second conductive linking portion is configured to provide a current path for plating;
separating comprises severing the first conductive linking portion and the second conductive linking portion; and
separating exposes part of the first conductive linking portion from the package body.

12. The method of claim 11, wherein:
providing the first substrate comprises providing a third pad with the first pad interposed between the second pad and the third pad;
attaching comprises attaching a third electronic device to the third pad, the third electronic device having a third orientation on the third pad in the top view;
providing the second substrate comprises providing:
a third conductive connector comprising:
a third plate portion comprising a third plate first side and a third plate second side; and
a third connective portion coupled to the third plate first side, wherein the third connective portion is interconnected with the first connective portion to provide an interconnected structure;
a fourth conductive connector comprising a fourth plate portion; and
a third conductive linking portion attached at one end to the third plate second side and attached at an opposite end to the fourth plate portion;
connecting comprises connecting the third plate portion to the third electronic device; and
separating comprises separating the interconnected structure and the third conductive linking portion.

13. The method of claim 12, wherein:
providing the second substrate comprises providing the interconnected structure comprising a first lead and a second lead;
attaching comprises:
attaching the first electronic device comprising a first power semiconductor device having a first control electrode; and
attaching the third electronic device comprising another power semiconductor device having a second control electrode;
the method further comprises:
coupling the first control electrode to the first lead; and
coupling the second control electrode to the second lead; and
separating comprises severing one or more of the first lead or the second lead from the interconnected structure.

14. The method of claim 11, wherein:
providing the second substrate comprises providing the first connective portion with a first lower side and the second connective portion with a second lower side;
forming the package body comprises exposing the first lower side and the second lower side from the package body; and
plating comprising plating the conductor on the first lower side and the second lower side.

15. The method of claim 11, wherein:
providing the second substrate comprises providing the first plate portion and the second plate portion each having at least four conductive linking portions attached thereto including the second conductive linking portion;
two of the at least four conductive linking portions are other than the second conductive linking portion and are on opposing sides of each of the first plate portion and the second plate portion; and
only the second conductive linking portion and another one of the at least four conductive linking portions are directly attached between both the first plate portion and the second plate portion.

16. A packaged electronic device, comprising: a pad having a pad top side and a pad bottom side; an electronic device coupled to the pad top side; a conductive plate coupled to the electronic device and comprising a first side and a second side;
a conductive member extending from the first side; a connective portion coupled to the conductive member and comprising a top side, a bottom side opposite to the top side, and a lateral side; a first conductive linking portion extending outward from the second side and comprising a first end distal to the conductive plate; a second conductive linking portion extending outward from another side of the conductive plate that is different than the first side and comprises a second end distal to the conductive plate; and a package body encapsulating the electronic device and comprising a package body bottom side, a package body first lateral side, and a package body second lateral side different than the package body first lateral side; wherein: the bottom side of the connective portion is exposed from the package body bottom side; the lateral side of the connective portion is exposed from the package body first lateral side; the first end of the first conductive linking portion is exposed from the package body second lateral side; and the second end of the second conductive linking portion is exposed from a package body lateral side that is different than the package body first lateral side.

17. The packaged electronic device of claim 16, further comprising:
a plated conductive material disposed adjacent to the bottom side of the connective portion.

18. The packaged electronic device of claim 17, wherein:
the first end of the first conductive linking portion and the second end of the second conductive linking portion comprise severed end surfaces that are devoid of the plated conductive material.

19. The packaged electronic device of claim 17, wherein:
the first end the first conductive linking portion is coplanar with the package body second lateral side.

20. The packaged electronic device of claim 17, wherein:
the conductive plate comprises a third side that is different than the second side and the first side;

the second conductive linking portion extends outward from the third side;

the package body comprises a package body third lateral side that is different than the package body second lateral side and different than the package body first lateral side; and the second end of the second conductive linking portion is exposed from the package body third lateral side.

* * * * *